(12) United States Patent
Chang et al.

(10) Patent No.: US 7,323,726 B1
(45) Date of Patent: Jan. 29, 2008

(54) METHOD AND APPARATUS FOR COUPLING TO A COMMON LINE IN AN ARRAY

(75) Inventors: Kuo-Tung Chang, Saratoga, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/658,882

(22) Filed: Sep. 9, 2003

(51) Int. Cl.
*H01L 29/76* (2006.01)

(52) U.S. Cl. .................... 257/202; 257/390; 257/128; 257/346; 257/387; 257/E29.17

(58) Field of Classification Search ............. 257/202, 257/128, 390, E29.1, 346, 387, E29.17
See application file for complete search history.

(56) References Cited

U.S. PATENT DOCUMENTS

| | | | | |
|---|---|---|---|---|
| 4,410,904 A | * | 10/1983 | Wollesen | ................. 257/391 |
| 5,047,814 A | * | 9/1991 | Hazani | .................... 257/317 |
| 5,659,500 A | * | 8/1997 | Mehrad | ............... 365/185.05 |
| 6,266,269 B1 | * | 7/2001 | Karp et al. | ............... 365/150 |
| 6,700,176 B2 | * | 3/2004 | Ito et al. | ................... 257/530 |
| 6,765,257 B1 | * | 7/2004 | Mehrad et al. | ............. 257/314 |
| 6,809,366 B2 | * | 10/2004 | Takahashi | ................ 257/298 |
| 2004/0238883 A1 | * | 12/2004 | Nishinohara et al. | ....... 257/330 |

* cited by examiner

*Primary Examiner*—Eugene Lee

(57) ABSTRACT

A method and apparatus for coupling to a common line in an array. Gate structures of an integrated circuit are formed. Source and drain regions adjacent to the gate structures are implanted. A source contact from a metal Vss line to a source region is formed. Dopants of the source and drain regions diffuse laterally to overlap. The overlapping diffusion regions conduct and couple the drain region to a source region. Beneficially, the drain region is coupled to the metal Vss line. As a beneficial result, source contacts may be formed along a line of drain contacts in associated rows of drain contacts, and coupled to a common source line via the novel overlapping diffusion regions. A plurality of word lines may be formed without any bending in the word lines to accommodate source contacts that are larger than the source line. Numerous deleterious consequences of bent word lines, for example decreased array density and detrimental electrical behavior of memory cells in the vicinity of bent word lines, may beneficially be overcome by embodiments of the present invention.

8 Claims, 8 Drawing Sheets

METHOD AND APPARATUS FOR COUPLING TO A COMMON LINE IN AN ARRAY

TECHNICAL FIELD

Embodiments of the present invention relate to design and manufacture of sub-micron metal oxide semiconductors. More particularly, embodiments of the present invention provide for a method and apparatus for coupling to a common line in an array.

BACKGROUND ART

A flash or block erase memory (flash memory), for example, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash memory cell includes a source, drain, floating gate and control gate to which various voltages are applied to program the cell with a binary 1 or 0, or erase all of the cells as a block. Programming occurs by hot electron injection in order to program the floating gate. Erasure employs Fowler-Nordheim tunneling effects in which electrons punch through a thin dielectric layer, thereby reducing the amount of charge on the floating gate. Erasing a cell sets the logical value of the cell to "1," while programming a cell sets the logical value to "0." The flash memory cell provides for nonvolatile data storage.

Prior Art FIG. 1 illustrates a typical configuration of a plan view of a section of a memory array 100 in a NOR-type of configuration for a memory device. Prior Art FIG. 1 is not drawn to scale. As shown in Prior Art FIG. 1, the array 100 is comprised of rows 10 and columns 120 of memory cells. Each of the memory cells are isolated from other memory cells by insulating layers (e.g., a plurality of shallow trench isolation regions (STI) 150).

The control gates of each of the memory cells are coupled together in each of the plurality of rows 110 of memory cells, and form a plurality of word lines 130 that extend along the row direction.

Bit lines extend in the column direction and are coupled to drain regions via drain contacts 168 in an associated column of memory cells 120. The bit lines are coupled to drain regions of memory cells in associated columns of memory cells 120.

A plurality of source lines 140 extend in the row direction and are coupled to the source regions of each of the memory cells in the array of memory cells 100. One source line is coupled to source regions in adjoining rows of memory cells, and as a result, one source region is shared between two memory cells. Similarly, drain regions are shared amongst adjoining rows of memory cells, and as a result, one drain region is shared between two memory cells.

A plurality of source contacts are coupled to the plurality of common source lines 140. Each of the plurality of source contacts 145 is formed in line with the associated common source line to which it is coupled. The source contacts are formed in a column 160, and may be coupled with each other. The column 160 is isolated between two STI regions and forms a dead zone in which no memory cells are present.

The well known Moore's Law of the semiconductor field states that the number of semiconductor devices, e.g., transistors, per unit area will double every 18-24 months. While other factors such as design improvements contribute, one of the fundamental drivers of this inexorable density increase is the ever shrinking minimum feature size of semiconductors. For example, a common minimum feature size of modern semiconductors is 0.11 microns.

As shown in FIG. 1, due to current photolithography limitations in forming contact vias, each of the plurality of source contacts 145 is larger than their associated common source lines 140. As a result, the common source lines 140 need to be widened in the region surrounding their associated source contacts 145. This is to accommodate the wider source contacts 145. As such, word lines one either side of the common source line 140 are bent to accommodate for the increased area for the common source line surrounding an associated source contact 145.

However, as the size of each memory cell and correspondingly, the array 100 itself is reduced, the bending of the word lines to accommodate for the size of the source contacts is limited by current photolithography and chemical vaporization deposition (CVD) techniques. For example, as the size shrinks, it becomes more difficult to form a pronounced bend in each of the plurality of word lines 130 at current pitches achievable by current photolithography techniques. As a result, the size of the overall array 100 is limited by the ability to bend the word lines 130.

Furthermore, the inability to form straight word lines in the region surrounding the source contacts 145 effects the uniformity of cells throughout the array 100. More specifically, the memory cells bordering the column of source contacts 160 that includes the source contacts 145 may have electrical characteristics (erase and program) that are different from those of memory cells that do not border a column of source contacts. Voltage thresholds and current leakage are specific problems. In particular, a change in the erasing characteristics of a memory cell bordering the column of source contacts 160 can alter the threshold voltage of the cell into the negative region. This causes cell current to always flow (leakage) irrespective of the associated word line potential. As such, memory cells lying on the same bit line as the defective cell will have an erroneous state being read.

Semiconductor processing equipment is extremely expensive. Fundamental semiconductor processing steps, e.g., implantation, diffusion and etching, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to standing waves within photoresist should be compatible with existing semiconductor processes and equipment without the need for revamping well established tools and techniques.

Accordingly, a need exists for a semiconductor memory device with better uniformity and performance uniformity between memory cells in an array of memory cells, thus leading to better fabrication yields. A further need exists for an array of memory cells that is more compact by extending beyond the size limitations due to source contact formation. An even further need exists for a word line formation that can accommodate the decreasing size of the array of memory cells using current photolithography techniques.

DISCLOSURE OF THE INVENTION

Embodiments of the present invention provide for a semiconductor memory device with better uniformity and performance uniformity between memory cells in an array of memory cells, thus leading to better fabrication yields. Further embodiments provide for an array of memory cells that is more compact by extending beyond the size limitations due to source contact formation. Still further embodiments provide for a word line formation that can accommodate the decreasing size of the array of memory cells using current photolithography techniques.

A method and apparatus for coupling to a common line in an array are disclosed. Gate structures of an integrated circuit are formed. Source and drain regions adjacent to the gate structures are implanted. A source contact from a metal Vss line to a source region is formed. Dopants of the source and drain regions diffuse laterally to overlap. The overlapping diffusion regions conduct and couple the drain region to a source region. Beneficially, the drain region is coupled to the metal Vss line. As a beneficial result, source contacts may be formed along a line of drain contacts in associated rows of drain contacts, and coupled to a common source line via the novel overlapping diffusion regions. A plurality of word lines may be formed without any bending in the word lines to accommodate source contacts that are larger than the source line. Numerous deleterious consequences of bent word lines, for example decreased array density and detrimental electrical behavior of memory cells in the vicinity of bent word lines, may beneficially be overcome by embodiments of the present invention.

Another embodiment of the present invention discloses an integrated circuit device comprising an array of cells. The cells comprise a source, a drain and a gate. The array has at least one common source line. A source contact is disposed outside of the common source line.

BEST MODE FOR CARRYING OUT THE INVENTION

In the following detailed description of the present invention, method and apparatus for coupling to a common line in an array, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Reference will now be made in detail to the preferred embodiments of the present invention, a semiconductor memory including a core memory array of memory cells with source line connections that facilitate straight word lines, and a method for producing the same. While the invention will be described in conjunction with preferred embodiments, it is to be understood that they are not intended to limit the invention to these embodiments. On the contrary, the invention is intended to cover alternatives, modifications and equivalents, which may be included within the spirit and scope of the invention as defined by the appended Claims.

Accordingly, the present invention discloses a memory device with better uniformity of performance between memory cells in an array of memory cells, more compactness in the array of memory cells, and higher yields for the array. Further, the present invention discloses a method for forming source line connections that facilitate easier fabrication of straight word lines in an array of memory cells using current photolithography techniques.

Method and Apparatus for Coupling to a Common Line in an Array

Embodiments of the present invention are described in the context of design and manufacture of semiconductor devices. However, it is appreciated that embodiments of the present invention may be utilized in other areas of electronic design and operation.

Figure 2:
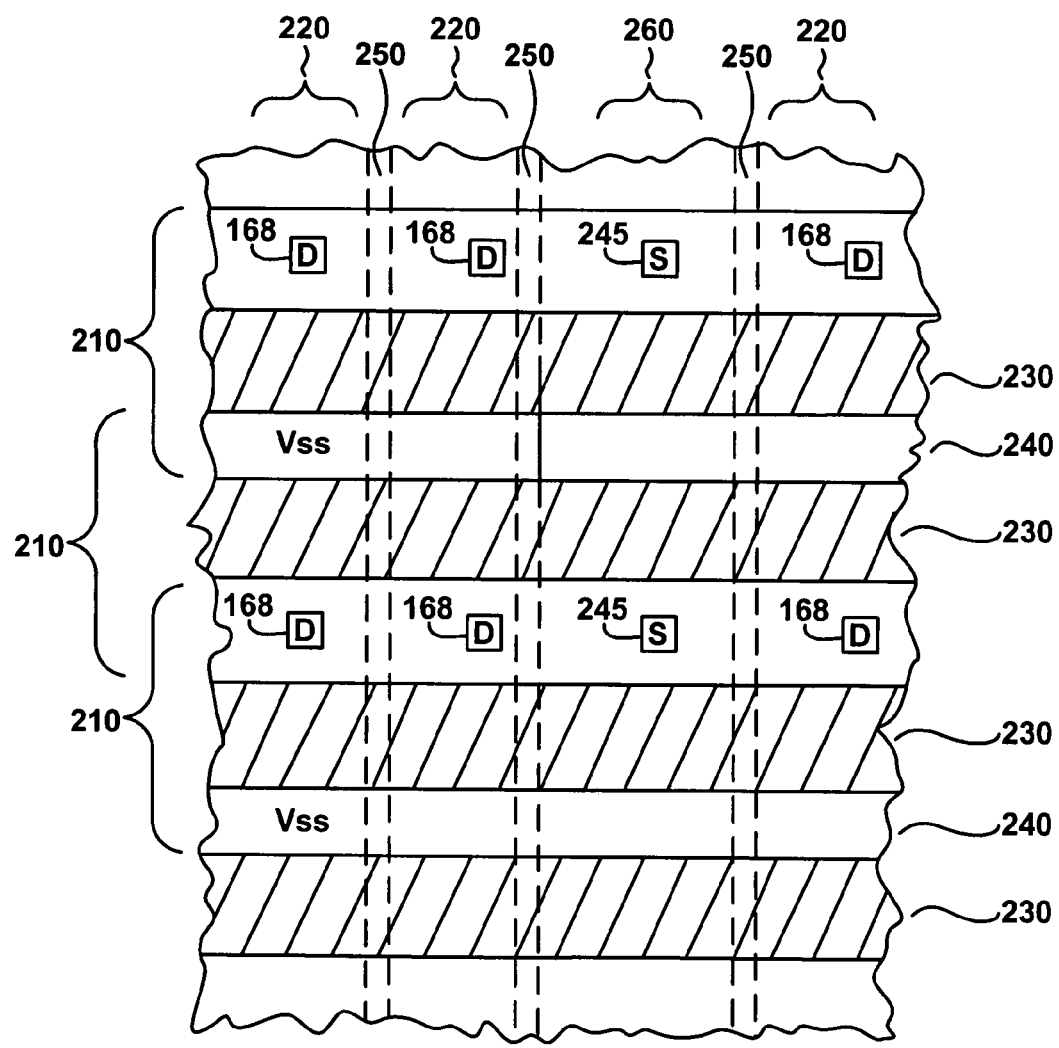
FIG. 2 illustrates a plan view of a section of a novel memory array in a NOR-type of configuration for a memory device, according to an embodiment of the present invention.

FIG. 2 illustrates a plan view of a section of a novel memory array 200 in a NOR-type of configuration for a memory device, according to an embodiment of the present invention. FIG. 2 is not drawn to scale. As shown in FIG. 2, the array 200 is comprised of rows 210 and columns 220 of memory cells. Each of the memory cells may be isolated from other memory cells by insulating layers (e.g., a plurality of shallow trench isolation regions (STI) 250). It is to be appreciated that each cell has a source and a drain. In general, the source and drain are constructed similarly, and may interchange roles depending, for example, on biases applied and/or subsequent interconnections to other circuit elements.

The control gates of each of the memory cells are coupled together in each of the plurality of rows 210 of memory cells, and form a plurality of word lines 230 that extend along the row direction.

Bit lines extend in the column direction and are coupled to drain regions via drain contacts 168 in an associated column of memory cells 220. The bit lines are coupled to drain regions of memory cells in associated columns of memory cells 220.

Figure 1:
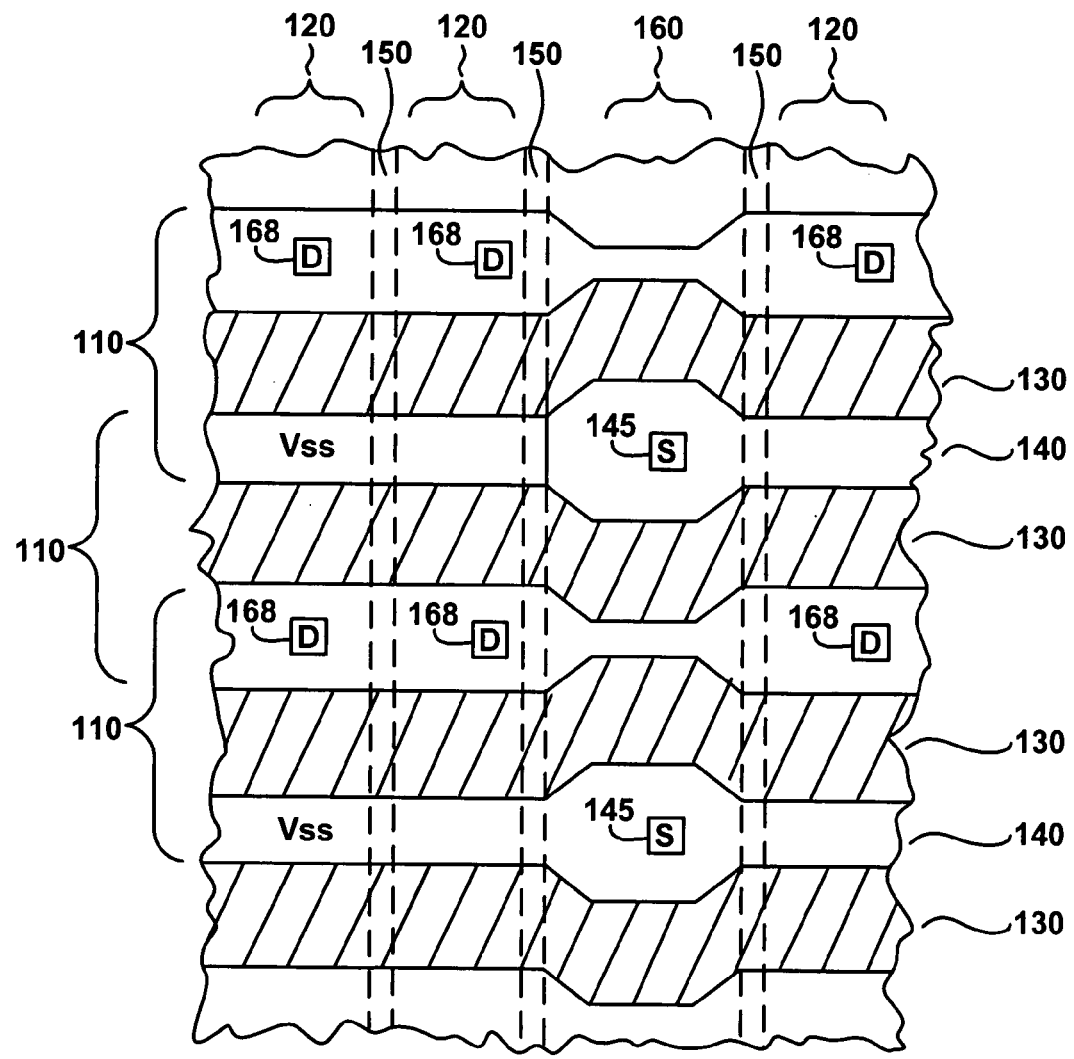
FIG. 1 (conventional art) illustrates a typical configuration of a plan view of a section of a memory array in a NOR-type of configuration for a memory device.

A plurality of common source lines 240 are present in array 200. In contrast with the conventional configuration of memory array 100 (FIG. 1), source contacts are not formed in common source lines 240.

A plurality of source contacts 245 is formed in line with drain contacts 168. Source contacts 245 may be similar in construction and dimension to drain contacts 168. The source contacts are formed in a column 260, and may be coupled with each other. The column 260 may be isolated between two STI regions to form a dead zone in which no memory cells are present.

Source lines 240 extend in the row direction and are coupled to the source regions of each of the memory cells in the array of memory cells 200. One source line is coupled to source regions in adjoining rows of memory cells, and as a result, one source region is shared between two memory cells. Similarly, drain regions are shared amongst adjoining rows of memory cells, and as a result, one drain region is shared between two memory cells. It is to be appreciated that word lines 230 are not bent, and consequently the numerous deleterious effects caused by such bending do not detract from the performance of array 200.

Figure 3:
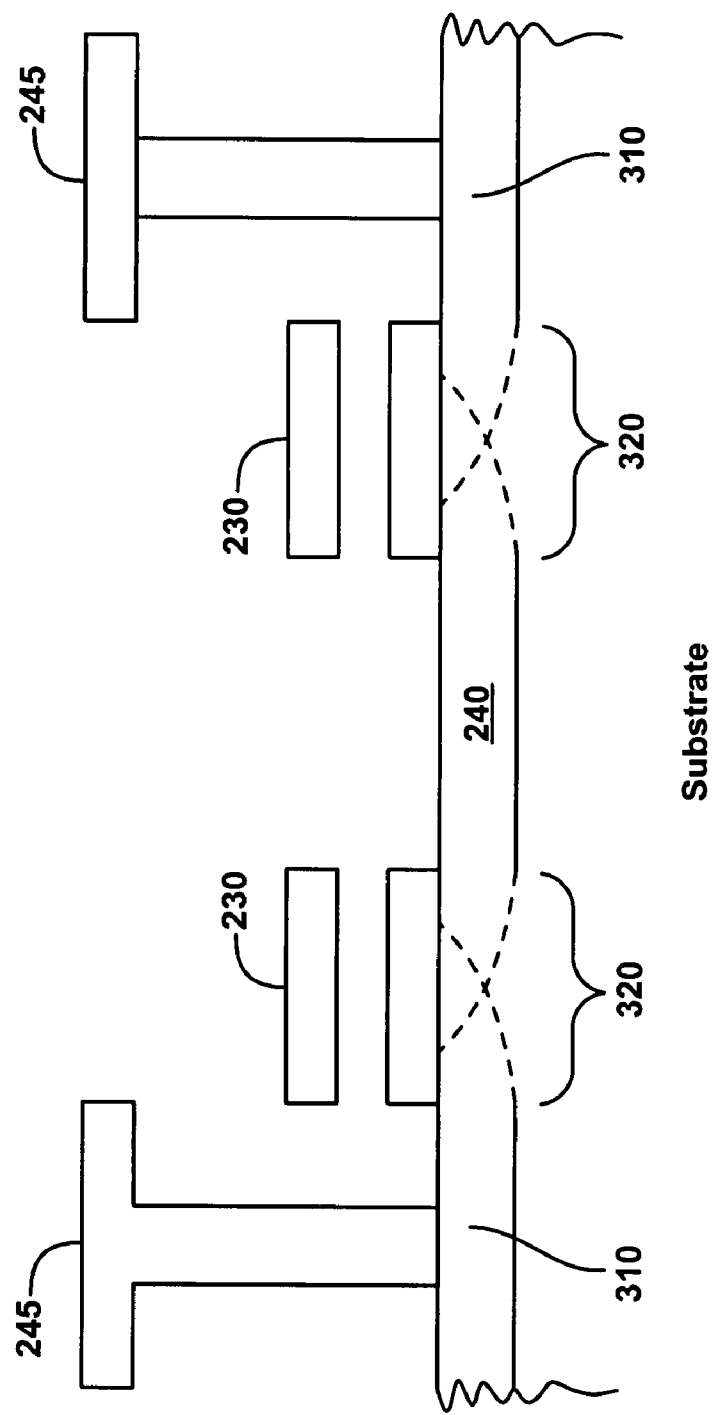
FIG. 3 illustrates a cross sectional view of a section of column, according to an embodiment of the present invention.

FIG. 3 illustrates a cross sectional view of a section of column 260, according to an embodiment of the present invention. FIG. 3 illustrates two source contacts 245 and two word lines 230. FIG. 3 is not drawn to scale.

Common source line 240 runs perpendicular to, i.e., in and out of, the plane of FIG. 3. Regions 310 are conductive regions in the semiconductor substrate formed, for example, by implantation of n-type dopants. Regions 320 are located below gate structures, and comprise migrated dopant materials. The migration is due to a process of lateral diffusion. In a conventional MOS device, regions 320 may typically form a channel region. In contrast, according to an embodiment of the present invention, well known parameters including dopant species, dopant concentration, implant energy, temperature and duration should be controlled so that regions 310 overlap with common source line 240 to form regions 320. More specifically, regions 310 should conduct to common source line 240.

Figure 4:
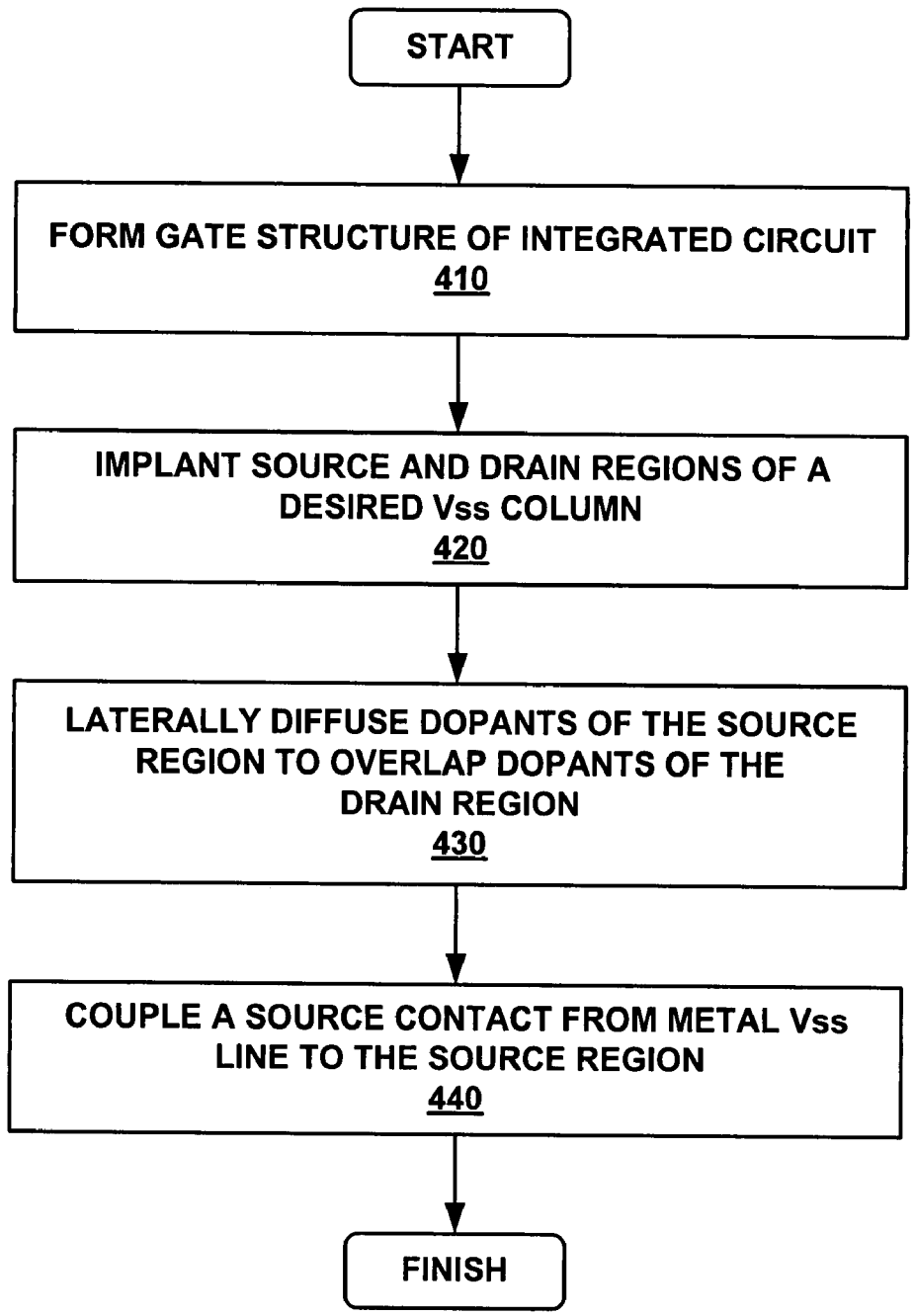
FIG. 4 illustrates a process for manufacturing a source connection in an integrated circuit, according to an embodiment of the present invention.

FIG. 4 illustrates a process 400 for manufacturing a source connection in an integrated circuit, according to an embodiment of the present invention.

In step 410, gate structures of the integrated circuit are formed. For example, a gate stack of a floating gate EEPROM cell may comprise a polysilicon floating gate, a tunnel oxide, a barrier oxide and a control gate. Alternatively, a SONOS EEPROM cell may comprise a nitride layer in place of the floating gate. These layers may be formed by well known processes in the semiconductor arts, including photolithography and growing of oxides. In many memory devices, control gates of a plurality of individual memory cells form part of a word line. It is appreciated that embodiments of the present invention are well suited to a wide variety of alternative cell constructions as well as alternative cell interconnection designs, for example, a NAND arrangement.

In step 420, a source and a drain region of a desired Vss column of the integrated circuit are implanted. Typically, for a P-substrate semiconductor, n-type (or n+) dopants are implanted on either side of the gate. Usually, the gate structure forms part of an implantation mask for forming the drain and source regions. It is appreciated that in many memory devices, the source and drain regions are constructed similarly, and at the individual cell level may function interchangeably. Embodiments of the present invention are well suited to non-symmetrical designs of a drain and source region.

In step 430, the dopants in the drain and source region are laterally diffused so that the doped regions overlap, for example by "baking" the semiconductor at elevated temperature for a specific time duration. While source are drain regions are conventionally diffused into the region under a gate, it is to be appreciated that conventional processing requires that the diffusion be controlled such that the doped regions do not overlap. If the drain and source regions overlap, a channel region is not formed and the particular gate, source and drain do not form a transistor device. Conventionally, such an overlapping diffusion would be considered a defect.

In contrast, embodiments of the present invention intentionally cause the drain and source regions to overlap such that they conduct independent of any voltage (or lack thereof) applied to the gate. The on-going decrease in a minimum feature size of semiconductors benefits embodiments of the present invention. In general, gates are constructed with a width as small as possible, being limited by the minimum feature size of the semiconductor process. Further, since the drain and source are typically formed outward from the edges of the gate, the drain and source are typically separated by approximately the minimum feature size.

Diffusion rates and distances are generally independent of process size, e.g., for the same dopants in the same concentration in the same materials at the same time and temperature, the dopants will diffuse approximately the same distance. Consequently, it is more straight forward to overlap a drain and source region under a gate if the gate is shorter. For example, it is more commercially feasible to overlap a drain and a source region by lateral diffusion under a gate constructed with a modern semiconductor process, e.g., with a minimum feature size of 0.11 microns, compared to a semiconductor process of the recent past, e.g., characterized by a larger minimum feature size of 0.3 microns.

In step 440, a contact from a metal Vss line is coupled to the source region of the particular cell. It is appreciated that in the present embodiment, the terms drain and source refer to regions rather than functions of the cell, and that the regions may be interchangeable. It is to be further appreciated that due to the overlapping source/drain regions, and the consequent conductance between the two regions, that the opposite side, e.g., the "drain" of the cell, is beneficially coupled to the metal Vss line.

It is to be appreciated that embodiments of the present invention are well suited to performing step 440 prior to step 430. It is generally desirable to impose minimum modifications to a semiconductor manufacturing process. Embodiments of the present invention should be practiced with minimal modifications to an existing semiconductor manufacturing process. An existing sequence of forming contacts, e.g., drain contacts, and diffusion cycles should determine the sequence of steps 430 and 440.

In this novel manner, source contacts may be formed along a line of drain contacts in associated rows of drain contacts, and coupled to a common source line via novel overlapping diffusion regions. A plurality of word lines may be formed without any bending in the word lines to accommodate source contacts that are larger than the source line. Numerous deleterious consequences of bent word lines, for example decreased array density and detrimental electrical behavior of memory cells in the vicinity of bent word lines, may beneficially be overcome by embodiments of the present invention.

FIGS. 5A through 5D present cross sectional views of a cell to further illustrate elements of process 400, according to an embodiment of the present invention.

Figure 5A:
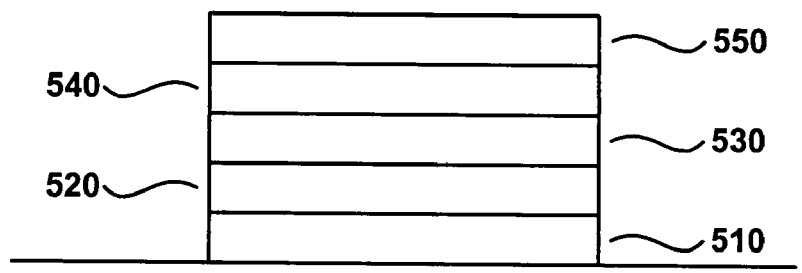
FIGS. 5A, 5B, 5C and 5D present cross sectional views of a cell to further illustrate elements of a process, according to an embodiment of the present invention.

In FIG. 5A, a gate structure is formed, according to an embodiment of the present invention. Illustrated are prominent features of a gate structure common to EEPROM memory cells. Control gate 550 is typically the uppermost element of a gate stack. Layer 530 may be a polysilicon structure for a floating gate cell, or it may be a nitride layer. Layers 510 and 540 are typically insulating oxide layers to electrically insulate layer 530. In a non-volatile memory cell, charge is stored in layer 530.

Figure 5B:
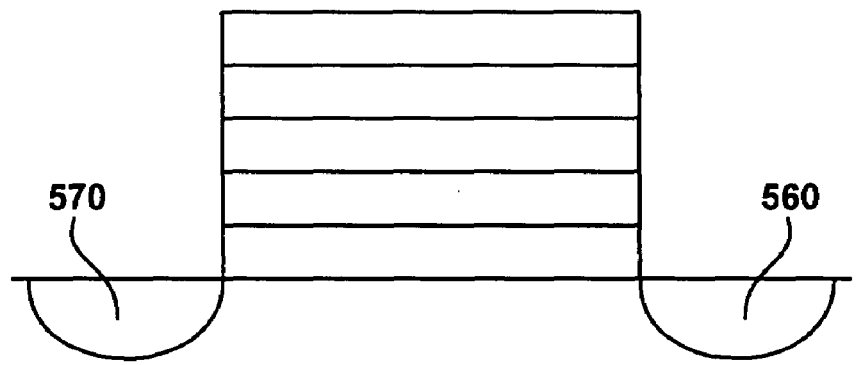

FIG. 5B illustrates an implantation of dopant materials, for example n-type dopants, into substrate 500, according to an embodiment of the present invention. Doped region 570 may be referred to as a "source" and doped region 560 may be referred to as a "drain." It is to be appreciated that in many memory cells, the construction of source and drain regions is similar, and at the cell level their roles may be interchanged.

Figure 5C:
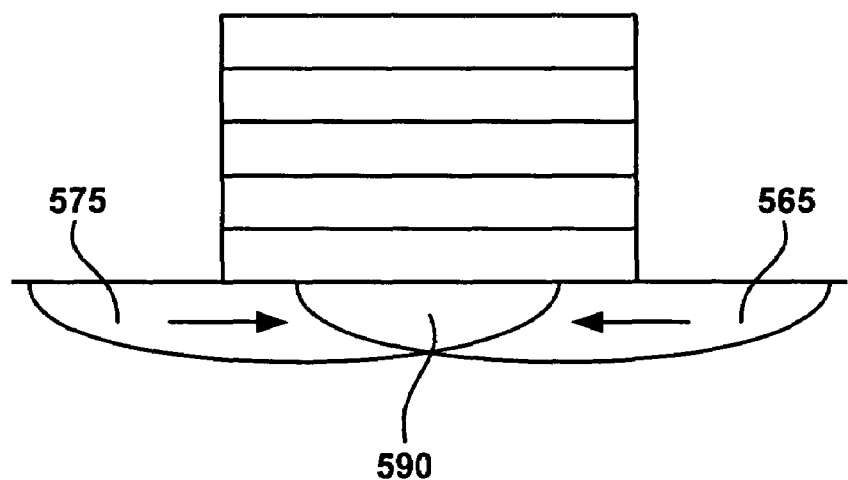

FIG. 5C illustrates a lateral diffusion of source and drain dopants so that they overlap, according to an embodiment of the present invention. At least a portion of region 590 is located below the gate structure. Region 590 is made conductive by the overlap of the doped and diffused regions 575 and 565. As a beneficial consequence, region 575 is coupled to region 565.

Figure 5D:
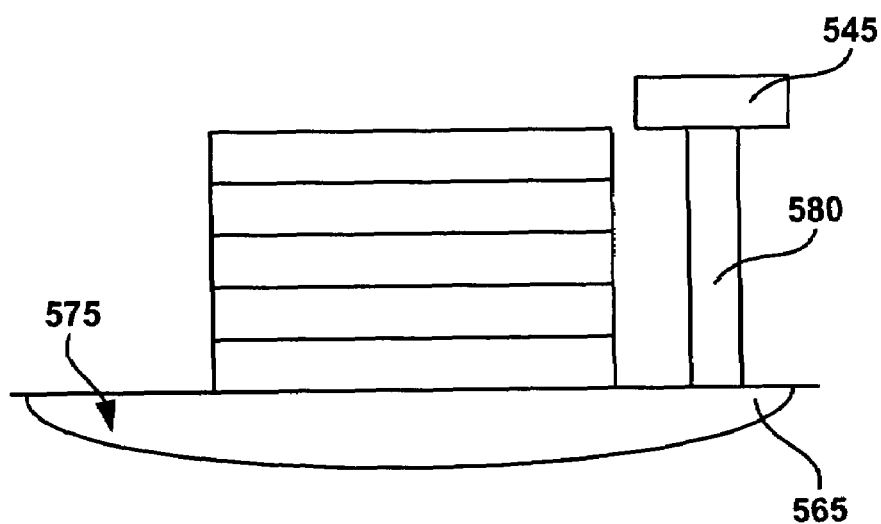

FIG. 5D illustrates the creation of a contact 580 to couple a Vss line 545 to diffused drain region 565, according to an embodiment of the present invention. Contact 580 may be formed by well known means, and should be constructed using similar tools and process steps to other metal connections of the semiconductor, e.g., drain contacts. Advantageously, Vss line 545 is coupled to diffused source region 575.

Embodiments of the present invention provide for a semiconductor memory device with better uniformity and performance uniformity between memory cells in an array of memory cells, thus leading to better fabrication yields. Further embodiments provide for an array of memory cells that is more compact by extending beyond the size limitations due to source contact formation. Still further embodiments provide for a word line formation that can accommodate the decreasing size of the array of memory cells using current photolithography techniques.

The preferred embodiment of the present invention, method and apparatus for coupling to a common line in an array, is thus described. While the present invention has been described in particular embodiments, it should be appreciated that the present invention should not be construed as limited by such embodiments, but rather construed according to the below claims.

What is claimed is:

1. An integrated circuit device comprising:
   an array of flash memory cells, said cells comprising a source, a drain and a stacked gate structure comprising a control gate, a charge trapping layer and an insulating layer, wherein a region under said stacked gate structure comprises overlapping lateral diffusions of implantation regions of said source and said drain;
   a common source line coupled with said source; and
   a source contact disposed outside of said common source line and coupled with said source, wherein said source contact is coupled to said common source line under said stacked gate structure through said drain, and wherein said source contact is disposed in a row with drain contacts.

2. The integrated circuit device of claim 1 comprising substantially straight word lines.

3. The integrated circuit device of claim 1 wherein said common source line has a substantially uniform width within said array of cells.

4. The integrated circuit device of claim 1 wherein said integrated circuit device comprises a non-volatile memory.

5. The integrated circuit device of claim 4 wherein said charge trapping layer is a floating gate.

6. An integrated circuit device comprising a first non-volatile flash memory cell comprising:
   a first stacked gate structure comprising a control gate, a charge trapping layer and an insulating layer;
   dopants disposed on either sides of said first stacked gate structure; and
   a first region under said first stacked gate structure comprising overlapping lateral diffusions of source and drain implantation regions, wherein said source and drain implantation regions are able to conduct independent of any voltage applied to said first stacked gate structure, wherein said source implantation region is coupled to a common source line, wherein a first source contact is disposed outside of said common source line and coupled with said source implantation region, wherein said first source contact is coupled to said common source line under said first stacked gate structure through said drain implantation region, and wherein said first source contact is disposed in a row of drain contacts.

7. The integrated circuit device of claim 6 further comprising a second non-volatile flash memory cell comprising a second stacked gate structure comprising a control gate, a charge trapping layer and an insulating layer, wherein a second region under said second stacked gate structure comprises overlapping lateral diffusions of source and drain implantation regions.

8. The integrated circuit device of claim 7 wherein the source region associated with said second stacked gate structure is coupled to a second source contact, wherein said second source contact is coupled with said common source line and disposed outside of said common source line, wherein said second source contact is coupled to said common source line under said second stacked gate structure, and wherein said second source contact is disposed in a row of drain contacts.

* * * * *